United States Patent [19]

Ivanovic

[11] 3,846,907

[45] Nov. 12, 1974

[54] CONTINUOUS GUIDANCE METHOD AND APPARATUS FOR INSTALLING DIP DEVICES ON CIRCUIT BOARDS

[76] Inventor: Borislav Ivanovic, 615 Almar, Santa Barbara, Calif. 93105

[22] Filed: Dec. 26, 1972

[21] Appl. No.: 318,203

Related U.S. Application Data

[63] Continuation of Ser. No. 99,338, Dec. 18, 1970, abandoned.

[52] U.S. Cl. ............... 29/626, 29/203 R, 29/203 B, 29/203 DT, 29/203 V, 29/203 P

[51] Int. Cl. ........................ H05k 3/30, H05k 13/02

[58] Field of Search ............ 29/626, 627, 577, 589, 29/203 R, 203 B, 203 DT, 203 DTS, 203 HT, 203 MW, 203 J, 203 P, 203 S, 206, 428; 227/85, 86, 87, 88, 89, 119, 2, 90; 174/52, DIG. 3

[56] References Cited

UNITED STATES PATENTS

| | | | |
|---|---|---|---|
| 3,225,595 | 12/1965 | Dorrer | 227/85 |
| 3,416,348 | 12/1968 | Carter et al. | 29/626 |
| 3,516,142 | 6/1970 | De Rose et al. | 29/206 X |
| 3,535,763 | 10/1970 | Helton | 29/206 X |
| 3,550,238 | 12/1970 | Allen et al. | 29/206 X |
| 3,564,691 | 2/1971 | Ackerman | 29/203 B |
| 3,570,099 | 3/1971 | Ackerman et al. | 29/203 B |
| 3,614,546 | 10/1971 | Avins | 29/577 X |

*Primary Examiner*—C. W. Lanham
*Assistant Examiner*—Joseph A. Walkowski
*Attorney, Agent, or Firm*—Henry M. Bissell

[57] ABSTRACT

A method for continuously guiding a DIP device throughout its installation on a circuit board wherein the lower parts of the device leads are offset from the plane of the wider upper parts and are guided during installation by guide walls with vertical grooves whose width and spacing complement those of the leads, the walls being in continual contact with the circuit board, and the grooves being aligned with circuit board holes into which the leads are to be inserted.

8 Claims, 6 Drawing Figures

CONTINUOUS GUIDANCE METHOD AND APPARATUS FOR INSTALLING DIP DEVICES ON CIRCUIT BOARDS

CROSS-REFERENCE TO RELATED APPLICATION

This application is a continuation of copending application Ser. No. 99,338 of Borislav Ivanovic for Continual Guidance Method For Installing DIP Devices on Circuit Boards, filed Dec. 18, 1970 and now abandoned.

BACKGROUND OF THE INVENTION

1. Field of the Invention

This invention relates to methods for inserting devices on circuit boards, and more particularly to a method for guiding a DIP (dual in-line package) device into position on a circuit board.

2. Description of the Prior Art

As used herein and in the claims, a DIP device is an electrical device having electrical components contained in a body, usually of the general shape of a rectangular prism, and two rows of terminal leads associated with two opposite side walls of the body, one row of leads being connected to one side wall, and the other row to the other side wall. Each of the leads has a leg portion and a wider shoulder portion, and is connected to the body of the device at the shoulder. The leads are bent at the shoulders, and extend downward from the sides of the body. The device usually has the general appearance of a centipede.

The DIP devices are normally inserted into position on circuit boards with the aid of a guide. A typical guide used in industry is a pair of jaws with opposing rows of comb-like fingers spaced to mesh with the rows of leads on the DIP's. The fingers are bent to cradle the device when the jaws are closed.

There are drawbacks to this guide. Because the device is cradled, the leads must necessarily extend beyond the bent fingers of the guide in order to permit insertion in sockets in the circuit board. This provides an opportunity for the legs to be bent out of shape, or even snapped, if they are not properly aligned with the sockets. Once the leads are inserted, the jaws must be opened to release the device. The DIP is then pushed into position without the benefit of a guide. The conventional guidance method is thus a partial one. The DIP device is not currently guided completely into position throughout the insertion procedure. Moreover, the use of releasable jaws necessitates a structure which is mechanically complex and expensive to manufacture.

One solution to the problem of providing total guidance might be to use opposing parallel walls with vertical slots or grooves instead of the aforementioned jaws. The grooves would be spaced to accommodate the leads, and the walls would be aligned over, and in contact with the circuit board so that the leads would be guided into the appropriate circuit board sockets. The walls would be removed after the device is fully inserted on the board.

The drawback with this solution is that it does not provide the initial guidance necessary to get the ends of the leads into the sockets. This is because the shoulder portion of the leads is wider than the leg portion, and therefore, the grooves in the walls must be wide enough to accommodate the shoulders as well as the legs. As a result, the grooves would be much wider than the sockets, permitting the leads to miss the sockets thereby causing them to buckle or break.

If the shoulder were no wider than the leg, this would be an adequate solution. Then the groove could be as narrow as the socket, thus precluding the leg missing the socket. However, it is desirable to have the shoulder wider than the leg for two reasons. First, it gives the lead added strength at the point where it is connected to the body of the DIP, rendering it much more difficult to be broken off. Second, it provides clearance space between the circuit board and the device, which is useful when the device must be coated in place, such as with epoxy. The clearance allows for total coating of the device.

The conventional methods of guiding the DIP devices during insertion are only 95% effective at best. While this would ordinarily be a relatively high percentage, 99.9 percent would provide a decided economic advantage in light of the millions of DIP devices used in industry today.

It is therefore an object of the present invention to provide a more efficient method for inserting DIP devices on circuit boards.

It is another object of this invention to provide a method for inserting DIP devices onto circuit boards which affords continuous guidance throughout the insertion operation.

A further object of this invention is to provide a new DIP device lead which can be continuously guided throughout the insertion of the device onto a circuit board and which retains the inherent advantages of conventional DIP device leads

SUMMARY OF THE INVENTION

These and other objects and advantages are achieved by the method and apparatus according to the invention wherein a portion of the leg of each of the leads on a DIP device is offset outward from a shoulder portion of each of the leads. The leads are then aligned for insertion into sockets on a circuit board by positioning the DIP device between two grooved parallel guide walls such that the offset portion of each of the leads is confined within a groove in the guide walls. The bottom edges of the walls are then placed in contact with the circuit board so that the grooves are longitudinally aligned with the sockets in the circuit board. The device is then urged toward the circuit board, the leads thereby being continuously guided into the sockets by the grooves in the guide walls, until the leads are seated in the sockets. Thus, the legs are continuously guided by the grooves from initial insertion into the holes until the device is entirely positioned on the circuit board.

BRIEF DESCRIPTION OF THE DRAWINGS

The invention will be described in greater detail with reference to the accompanying drawings in which.

DESCRIPTION OF THE PREFERRED EMBODIMENT

Figure 1:
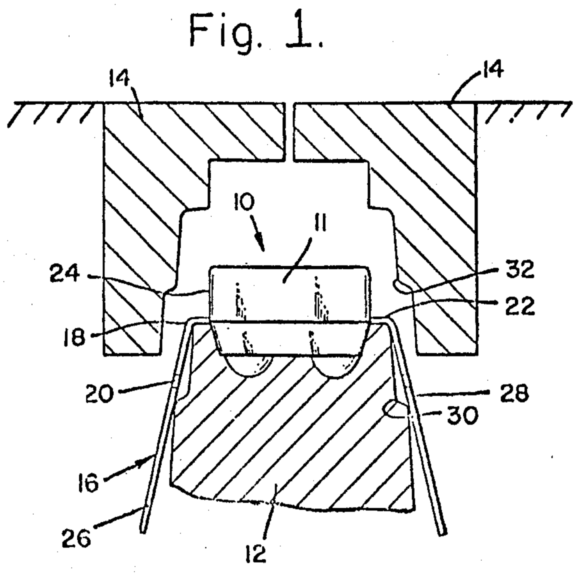
FIG. 1 is a cross-sectional view of a DIP device positioned in a coining jig for forming an offset bend in its leads.

Referring now to FIG. 1, there is shown a DIP device 10 whose body 11 is mounted on a coining press 12 which mates with an anvil 14. Terminal leads 16 each comprise a shoulder portion 18 with an essentially L-shaped profile, and an arm 20 which extends essentially orthogonally from the shoulder 18. Broad surfaces 22 of the leads 16 are in a common plane generally orthogonal to opposite side walls 24 of the body 11. Each arm 20 has a lower portion 26 whose broad-wall surface 28 is narrower than the width of the broad surfaces 22. When each lead 16 is pressed against the anvil 14 by the press 12, an offset bend (see FIGS. 2 and 2(a)) in the lower portion 26 of the arm 20 results, due to the pressure of the press corner 30 against its anvil corner complement 32. While the broad-wall surfaces 28 of the lower portions 26 of the arms 20 are shown to be relatively flat, they may also be curved, i.e., the lower portions 26 may be round.

Figure 2:
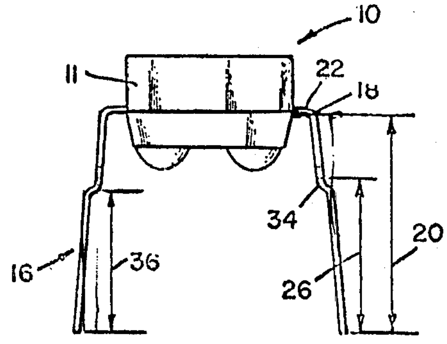
FIG. 2 is an end view of a DIP device with leads having offset bends.
Figure 2A:
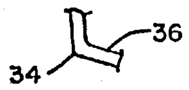
FIG. 2(a) is a blowup of the offset bend shown in FIG. 2.

Referring now to FIG. 2, there is shown a DIP device 10 formed according to the invention, each of whose leads 16 has an offset bend 34 in the lower portion 26 of the arm 20. This offset bend 34 gives rise to an offset portion 36 of the arm 20 which is offset into a plane separate from that of the rest of the arm 20.

While the offset bend 34 may be formed by coining as shown in FIG. 1, other coining procedures may be used, as well as any other methods of forming the offset bend 34, such as rolling or crimping. Nor need the offset bend 34 be an S-shaped bend. The purpose of the offset bend 32 is to render the plane of the offset portion 36 of the arm 20 separate from that of the rest of the arm 20. Therefore, a single bend or curve would suffice, so long as the offset portion 36 is bent outward from the shoulder 18, i.e., is in a plane either parallel to, or oblique with respect to the plane of the rest of the arm 20. The actual bend 32 itself may be a curve or a sharp corner or any other shape which achieves the aforementioned purpose, such as, but not limited to, the bend shown in FIG. 2(a).

Figure 3:
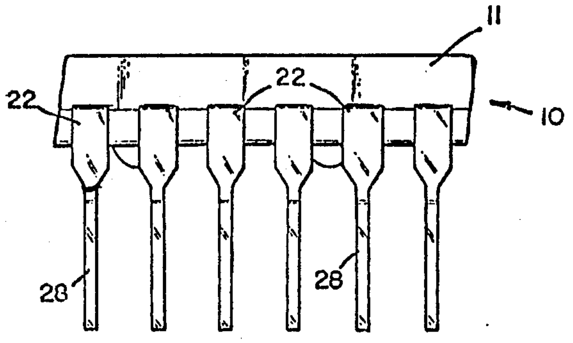
FIG. 3 is a side view of the DIP device shown in FIG. 2.

FIG. 3 is a side view of the DIP device 10, wherein can be seen the relative widths of the broad surfaces 22 and the narrowere broad-wall surfaces 28. While the former is shown to taper gradually to the latter, it may just as well end abruptly at the onset of the latter.

The offset bend 34 is preferably formed a small distance below the onset of the lower portion 26 of the arm 20 as shown. While it may be formed at the onset of the lower portion 26, such formation is preferably avoided lest a weak point be created, rendering it easy to snap off this lower portion 26.

Figure 4:
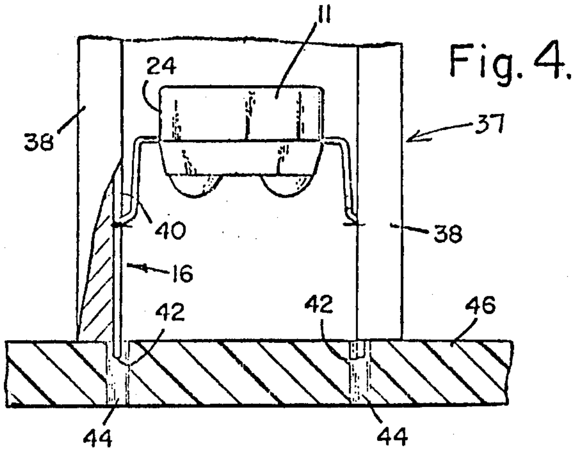
FIG. 4 is an end view of the DIP device shown in FIG. 2 being held between the two guide walls during installation on a circuit board.

FIG. 4 is an end view of the DIP device 10 in position between two essentially parallel opposed guide walls 38 of a guide member 37. The guide walls 38 have vertical grooves 40 whose width and spacing complement the width and spacing of the offset portions 36 of the arms 20. The cutaway portion of the guide wall 38 in FIG. 4 shows the offset portion 36 of one of the leads 16 vertically positioned in one of the grooves 40 in the wall 38. Ends 42 of the leads 16 are seen partially inserted into sockets 44 in a conventional circuit board 46.

The DIP device 10 is placed between the guide walls 38 by installing it upwards from the bottom, relative to the position of the guide, thus preventing damage to the arms 20. The device 10 is held in position by the outward tension of the offset portions 36 of the arms 20 against the grooves 40.

The grooves 40 in the guide walls 38 are aligned with the sockets 44 by a template, a numerically controlled positioner, or by any other conventional method compatible with the invention. This ensures that the ends 42 of the leads 16 will be inserted in the sockets 44. The walls 38 are in contact with the circuit board 46 throughout the entire insertion operation so that the leads 16 never extend beyond the guide walls 38 until the DIP device is ejected to insert the leads 16 in the sockets 44.

Furthermore, as is evident in FIG. 4, the shoulders 18 clear the grooves completely, because of the offset bend 34 in the arms 20. This arrangement provides continuous guidance of the leads 16 into the sockets 44 from, and including, the time the leads 16 are first inserted into the sockets 44 until the DIP device 10 is finally seated in position on the circuit board 46. The DIP device may be pushed into position manually or by an automatic plunger moving downward through the central opening between the guide walls 16, or any other means suited to this invention.

Figure 5:
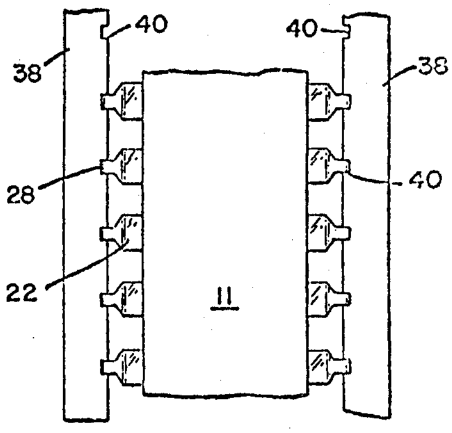
FIG. 5 is a top view of the DIP device and guide walls shown in FIG. 4.

FIG. 5 shows the offset portions 36 of all the leads 16 of the same DIP device 10 of FIG. 4, the view being taken from the top. The offset portions 36 are seen to be offset from the broad-surfaced portions of the leads 16.

There has thus been shown and described methods and apparatus for particularly shaping and completely guiding such a particularly shaped DIP device during installation on a circuit board. Although specific embodiments of the invention have been described in detail, other variations of the embodiments shown may be made within the spirit, scope and contemplation of the invention.

Accordingly, it is intended that the foregoing disclosure and drawings shall be considered only as illustrations of the principles of this invention, and are not to be construed in a limiting sense.

What is claimed is:

1. The method of guiding while inserting into a circuit board a dual in-line package device having opposed sets of terminals extending outward from the package and bent to permit insertion of the terminals in a circuit board socket, each of said terminals having a shoulder portion adjacent the package and a leg portion remote from the package and narrower than the shoulder portion, the leg portions of each set being located in a plane distinct from the shoulder portions thereof, comprising the steps of:

receiving the device within a guide member having opposed grooved walls outboard of the shoulder portions while constraining each of the individual terminal leg portions on three sides throughout the major extent of the narrow portion of the terminal;

locating the guide member and device adjacent a circuit board socket such that the leg portions are aligned with corresponding socket openings;

moving the device from its position within the guide member toward the circuit board and inserting the leg portions into the respective socket openings while continuing to constrain the leg portions during said movement; and removing the guide member from its position adjacent the circuit board without spreading said walls while leaving the device mounted in said socket.

2. The method of claim 1 wherein the locating step includes positioning the guide member in physical contact with the circuit board socket to minimize the distance for the leg portions to traverse between the constraining grooves and the socket openings in order to reduce the incidence of failure in the insertion of DIP devices in sockets.

3. The method of claim 1 further including the step of bending the terminals prior to the receiving step into a convfiguration such that the leg portions are in a plane distinct from the plane of the shoulder portions.

4. The method of claim 3 wherein the shoulder portions of the terminals are bent through a substantially right angle and the bending step comprises bending the leg portions of the terminals into a generally S-shaped configuration at a point near the juncture of the leg portion and the shoulder portion such that the leg portion below the S-shape is substantially parallel to and outwrdly offset from the shoulder portion nearest said juncture.

5. Apparatus for guiding a dual in-line package device having opposed sets of terminals extending outward from the package and bent to permit insertion of the terminals in a circuit board socket, each of said terminals having a shoulder portion adjacent the package and a leg portion remote from the package and narrower than the shoulder portion, the leg portions of each set being located in a plane distinct from the shoulder portions thereof, comprising:

a guide member having opposed grooved walls, each of the grooves being spaced to receive the corresponding terminal leg portion and having three sides to constrain the leg portion during movement within the groove and prohibit lateral movement of the leg portion during insertion, the three sides meeting at right angles to each other, the grooves being open at the bottom ends thereof and only wide enough to receive the narrow leg portions of the terminals to the exclusion of the inboard wider shoulder portions thereof, the walls being in respective planes distinct from the shoulder portions of the terminals whose leg portions are contained therein; and the guide member defining a central opening to permit ejection of the device therefrom.

6. Apparatus in accordance with claim 5 wherein the grooves are also open at the upper ends thereof.

7. Apparatus in accordance with claim 5 further including means for configuring the terminals of a dual in-line package device so that the leg portions thereof are situated in a plane which is distinct from and outboard from the shoulder portions of said terminals.

8. Apparatus in accordance with claim 7 wherein the configuring means comprises means for bending the leg portion of each terminal into a generally S-shaped configuration at a point near the juncture of the leg portion and the shoulder portion such that the leg portion below the S-shape is substantially parallel to and outwardly offset from the shoulder portion nearest said juncture.

* * * * *